United States Patent [19]

Tan et al.

[11] Patent Number: 4,480,200
[45] Date of Patent: Oct. 30, 1984

[54] ZERO-CROSSING POINT DETECTION CIRCUIT

[75] Inventors: Yoichi Tan; Fumio Miyao, both of Kanagawa, Japan

[73] Assignee: Fuji Xerox Co., Ltd., Kanagawa, Japan

[21] Appl. No.: 336,812

[22] Filed: Jan. 4, 1982

[30] Foreign Application Priority Data

Jan. 8, 1981 [JP] Japan .................. 56-1350

[51] Int. Cl.³ .......................... H03K 5/153
[52] U.S. Cl. ................... 307/354; 307/290; 307/360
[58] Field of Search ........ 307/290, 354, 360, 252 UA; 328/20, 150

[56] References Cited

U.S. PATENT DOCUMENTS

| | | | |
|---|---|---|---|
| 3,909,717 | 9/1975 | Gazzano | 328/20 |
| 3,939,432 | 2/1976 | Nelson | 307/354 |
| 3,952,213 | 4/1976 | Fukaya | 307/290 |

Primary Examiner—John Zazworsky
Attorney, Agent, or Firm—Sughrue, Mion, Zinn, Macpeak & Seas

[57] ABSTRACT

The upward and downward transitions of an input signal are independently detected with undirectional hysteresis in opposite directions. The detection signals are then combined to provide a level crossing detection signal having no time lag and immune to small noise signals.

9 Claims, 26 Drawing Figures a b c d1 e d2

$e_1$ $e_2$

THRESHOLD VALUE OF THRESHOLD CIRCUIT 47 $f_1$

THRESHOLD VALUE OF THRESHOLD CIRCUIT 48 $f_2$ $g_1$ $g_2$ h

{ 4,480,200 }

ZERO-CROSSING POINT DETECTION CIRCUIT

BACKGROUND OF THE INVENTION

This invention concerns a zero-crossing point detection circuit.

Zero-crossing point detection circuits are well known for detecting the instances at which a signal voltage changes from a negative level to a positive level and from the positive level to the negative level, such as in FM demodulators, phase synchronization circuits, bit timing information extraction circuits in data transmission, or the like.

Heretofore, such zero-crossing point detection circuits have included a level comparator consisting of a differential operational amplifier of high gain, a differentiation circuit and a full-wave rectification circuit. Further, with the development of digital circuits in recent years, a combination of a delay circuit and an EXCLUSIVE OR circuit has been used in some circuits in place of the differentiation circuit and the full-wave rectification circuit.

FIG. 1 shows one example of the former and FIG. 2 shows one example of the latter. The zero-crossing point detection circuit shown in FIG. 1 comprises a level comparator 1, a differentiation circuit consisting of a capacitor C1 and a resistor R1, and a full-wave rectification circuit consisting of a transformer T1 and diodes X1 and X2. An input signal shown in FIG. 3(a) is inputted into the level comparator 1 to be processed as shown in FIG. 3(b), then differentiated in the differentiation circuit into the form shown in FIG. 3(c) and processed in the full-wave rectification circuit into the waveform as shown in FIG. 3(d), which waveform then appears across an output resistor R2.

On the other hand, the zero-crossing point detection circuit exemplified in FIG. 2 comprises a level comparator 1, a pulse delay circuit 2 connected to the output of the comparator, and an EXCLUSIVE OR circuit 3 for receiving the output from the level comparator 1 and the output from the pulse delay circuit 2. The input signal is processed in the level comparator 1 into the waveform as shown in FIG. 3(b), delayed in a delay circuit 2 as shown in FIG. 3(e) and, as a result, outputted from the EXCLUSIVE OR circuit as pulses shown in FIG. 3(f).

While these conventional zero-crossing point detection circuits are advantageous in that they can operate even when the level for the input signals is low, this advantage is accompanied by the disadvantage that they operate in response to unnecessary small signals such as noise which may occur in the absence of input signals. In order to overcome the foregoing disadvantage, the use of a Schmitt circuit has been considered, but in such a case, the output from the circuit will be displaced from the exact time points of the zero-crossing, and AM components in the input signals appear as phase jitter in the output.

SUMMARY OF THE INVENTION

In view of the foregoing, an object of this invention is to eliminate the above defects in the prior art and to provide a zero-crossing point detection circuit that can exactly detect the zero-crossing points in input signals and does not respond to minute input signals such as noise.

In accordance with this invention, a pair of Schmitt circuits are provided having, as a common input, such input signals that change positively or negatively with respect to a certain center voltage, the Schmitt circuits having rectifying diodes in their positive feed back circuits in directions opposing to each other, a first level of the input signal that causes each of the Schmitt circuits to change from a first state to a second state and a second level of the input signal that causes each of the Schmitt circuits to change from the second state to the first state being made asymmetrical with respect to the certain voltage referred to above, and one of the levels for each Schmitt circuit coincides with the certain voltage, and further provides a synthetic circuit that receives the output from each of the Schmitt circuits to generate a signal representing the zero-crossing points.

With such a configuration, the insensitivity to minute signals of the Schmitt circuits due to the hysteresis characteristics is advantageously utilized, and the output states of the Schmitt circuits are changed in accurate coincidence with one of the zero-crossing points as the input signal changes from positive to negative or from negative to positive levels by the insertion of rectifying diodes in the positive feed back circuits. Thus, by synthesizing outputs from the two Schmitt circuits, signals accurately representing the zero-crossing points can be obtained.

BRIEF DESCRIPTION OF THE DRAWINGS

FIGS. 7(a)–7(i) are waveform charts for each of the sections in the circuit shown in FIG. 6.

DETAILED DESCRIPTION OF THE INVENTION

Zero-crossing point detection circuits according to this invention will now be described by way of its preferred embodiments referring to FIG. 4 and succeeding figures in the accompanying drawings.

Figure 4:
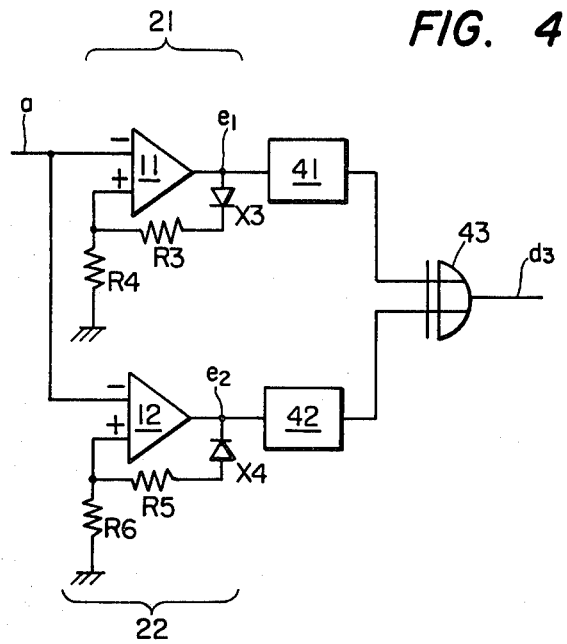
FIG. 4 is a circuit diagram for one embodiment of the zero-crossing point detection circuit according to this invention.

FIG. 4 shows a circuit diagram for one embodiment of the zero-crossing point detection circuit according to this invention. The zero-crossing point detection circuit comprises a pair of differential operational amplifiers 11 and 12, one of the inputs for each of which are connected as a common input. Other inputs of the differential operational amplifiers 11 and 12 are connected to the output by way of diodes X3 or X4 and resistors R3 and R5, respectively, and further connected by way of resistors R4 and R6 to ground to thereby constitute Schmitt circuits 21 and 22. Further, the diodes X3 and X4 are connected in directions opposite to each other.

The outputs from the Schmitt circuits are respectively connected to level converters 41 and 42 where they are converted into a voltage corresponding to the standard logic signal level and then sent to an EXCLUSIVE OR circuit 43.

Usual Schmitt circuits containing no diodes have such hysteresis characteristics that the output state of the circuits changes not at the zero-volt level but at $-\Delta V$ and $+\Delta V$ in the input signals as set by the resistors R3 and R4, R5 and R6, or the like. However, by the diodes inserted into the positive feed back loops, one of the voltages in the input level that cause the state of the circuit to change can be set to the zero-volt level. Specifically, in the case of the Schmitt circuit 21 in which the anode of the diode is connected to the output of the differential amplifier, when the input is negative the output $e_1$, will be positive and some voltage $+\Delta V$ will appear at the non-inverting input terminal. Thus, the state of the circuit changes at this $+\Delta V$ level of the input signal when the input signal changes from negative to positive. However, due to the diode X3, the output level changes at the zero-volt level of the input signal when the input signal changes from positive to negative. Similarly, in the case of the Schmitt circuit 22 in which the cathode of the diode is connected to the output of the differential amplifier, the state of the circuit changes at the zero-volt level of the input signal when the input signal changes from negative to positive and changes at $-\Delta V$ when the input signal changes from positive to negative. Thus, the zero-crossing points can be detected exactly although independently from each other. Consequently, the output signals synthesized in the EXCLUSIVE OR circuit 43 accurately represent the zero-crossing points.

Figure 5A:
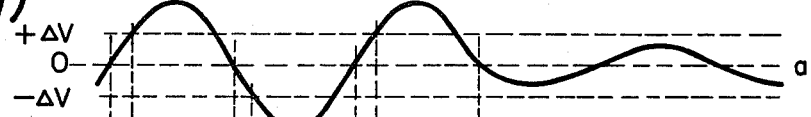
FIGS. 5(a)–5(f) are waveform charts for each of the sections in the circuit shown in FIG. 4.
Figure 5B:
Figure 5C:
Figure 5D:

For instance, when an input signal as shown in FIG. 5(a) is supplied to the zero-crossing point detection circuit in FIG. 4, the output signal $e_1$ from the Schmitt circuit 21 falls at the $+\Delta V$ level of the input signal when the input signal changes from negative to positive and the Schmitt circuit 21 output rises at the zero-volt level of the input signal when the input signal changes from positive to negative, to thereby form a pulse signal $e_1$ as shown in FIG. 5(b). On the other hand, the output signal from the Schmitt circuit 22 falls at the zero-volt level of the input signal when the input signal changes from negative to positive and rises at the $-\Delta V$ level of the input signal when the signal changes from positive to negative, to thereby form a pulse signal $e_2$ as shown in FIG. 5(c). Then, when the input signal has such a small level that any changes are within a range between $+\Delta V$ and $-\Delta V$, no zero-crossing points are detected and the two Schmitt circuits 21 and 22 do not change their states. Accordingly, the EXCLUSIVE OR circuit 43 issues a pulse signal $d_3$ as shown in FIG. 5(d).

Figure 1:
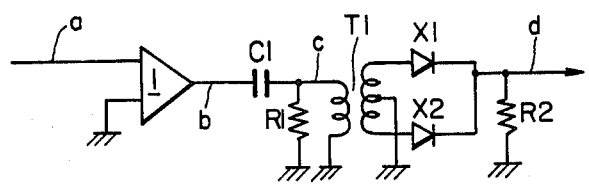
FIG. 1 and FIG. 2 are circuit diagrams illustrating conventional zero-crossing point detection circuits.
Figure 2:
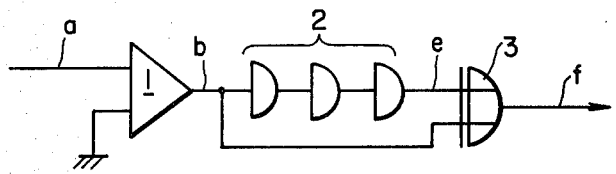
Figure 3A:
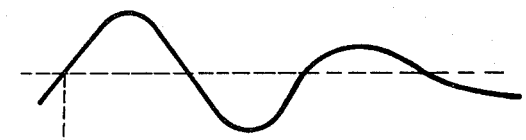
FIGS. 3(a)–3(f) are a waveform chart for each of the sections in the circuits shown in FIG. 1 and FIG. 2.
Figure 3B:
Figure 3C:
Figure 3D:
Figure 3E:
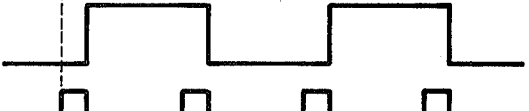
Figure 3F:
Figure 5E:
Figure 5F:

The zero-crossing point detection circuit shown in FIG. 4 can accurately detect the zero-crossing points without responding to minute signals. As will be apparent from the comparison between the output waveform of FIG. 5(d) shown in FIG. 5(e) where the input signal as shown in FIG. 5(a) is inputted into a Schmitt circuit having no diodes inserted in the positive feed back circuits, no delay is encountered in the circuit using the diodes X3 and X4. Further, as is apparent from the comparison of FIG. 5(d) with the output waveform shown in FIG. 5(f) wherein the signal as shown in FIG. 5(a) is inputted into the circuit shown in FIG. 1 or FIG. 2, the circuit according to the present invention will not respond to minute signals such as noise.

Figure 6:
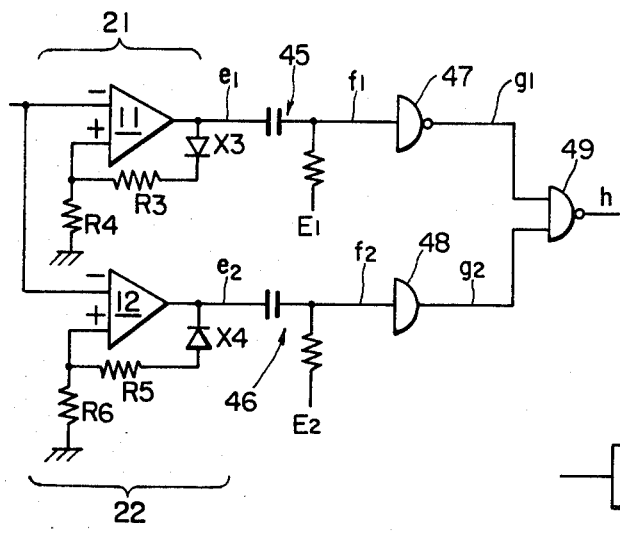
FIG. 6 is a circuit diagram for another embodiment of the zero-crossing point detection circuit according to this invention.
Figure 7A:
Figure 7B:
Figure 7C:
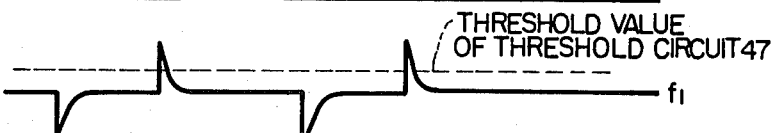
Figure 7F:
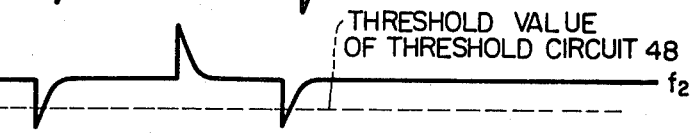
Figure 7G:
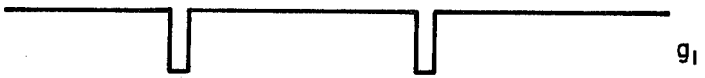
Figure 7H:
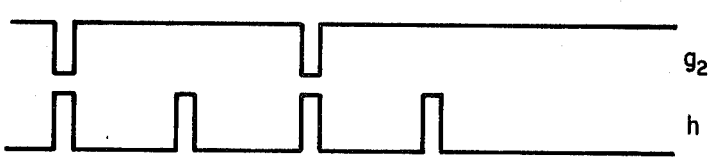
Figure 7I:

FIG. 6 shows a modified embodiment of the zero-crossing point detection circuit according to this invention, in which the level conversion circuits 41, 42 and the EXCLUSIVE OR circuit 43 shown in FIG. 4 are replaced with differentiation circuits 45, 46 and circuits 47, 48 and 49. When a signal as shown in FIG. 5(a) is inputted, the Schmitt circuit 21 outputs a signal as shown in FIG. 7(a), which is differentiated in a differentiation circuit 45 into a signal as shown in FIG. 7(c), and sent to an inversion type threshold circuit 47 where it is converted into a signal as shown in FIG. 7(g). On the other hand, the Schmitt circuit 22 issues a signal as shown in FIG. 7(b), which is differentiated in the differentiation circuit 46 into a signal as shown in FIG. 7(f) and then sent to a non-inversion type threshold circuit 48 where it is converted into a signal as shown in FIG. 7(h). Then, the outputs from the threshold circuits 47 and 48 are sent to a NAND circuit 49 to obtain a signal as shown in FIG. 7(i).

As apparent from the foregoing description, in the zero-crossing point detection circuit according to this invention, zero-crossing points in the input signals that change from positive to negative and from negative to positive are detected independently by the two Schmitt circuits each having a diode in its positive feed back loop in directions opposite to each other, whereby the zero-crossing points in the normal input signals exceeding an optionally set level can be detected accurately irrespective of the fluctuations in the level, without responding at all to input signals lower than the set level referred to above. As a result, only the zero-crossing points in the input signals of interest will be detected accurately without detecting the zero-crossing points in the signals whose detection is not desired such as transient noises, noises in the absence of input, and the like. Moreover, the detection circuit shows no delay in operation and is simple in structure.

As apparent from FIG. 4 and FIG. 6, the synthesizing circuit following the Schmitt detection circuits can be constituted in any desired form and it will be apparent to those skilled in the art that the conditions for connection with subsequent circuits can be modified in various ways.

Figure 8:
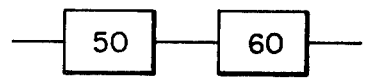
FIG. 8 is a block diagram of one application of the invention.

FIG. 8 shows an example wherein the zero-crossing point detection circuit according to this invention is applied to an FM demodulator. In the drawing, reference numeral 50 represents the zero-crossing point detection circuit shown in FIG. 4 and reference numeral 60 represents an ordinary FM demodulation circuit, which may include a combination of a one shot circuit and a low pass filter or, more generally, a frequency discrimination circuit, or phase synchronization loop, which has recently been frequently employed.

As is well known, information to be transmitted is contained in the phase term of the carrier waves in FM signals, and all of the AM components resulting from the transmission path are converted into unnecessary signals (noises) upon demodulation so that the AM components are usually eliminated by a limiter before the demodulator. However, as stated above referring to FIG. 1 and FIG. 2, noises in the absence of the input signal cause various disadvantages. As a countermeasure, a squelch circuit or the like is typically provided as required so that the input signals to the FM demodulator are disconnected when the input level goes lower than a certain threshold level.

By the use of the zero-crossing point detection circuit according to this invention as shown in FIG. 8, however, such a limiter or squelch circuit as referred to above is no longer necessary and the disadvantageous effects on the subsequent circuits are eliminated.

Further, the zero-crossing point detection circuit according to this invention can be used as a frequency doubling circuit in a carrier wave regeneration circuit of a medium speed facsimile unit. In an AM-PM-VSB (amplitude, phase and vestigial sideband modulation) modulation and demodulation system which is used as a standard transmission system in the medium speed facsimile unit, the phase information is extracted and, at the same time, frequency doubled signals are outputted by detecting the zero-crossing points both for positive to negative and negative to positive transitions. Furthermore, the circuit does not extract erroneous phase information and stabilizes the operation of the subsequent phase synchronization loop even upon disconnection of the input signals during black signal transmission.

As is clear from the above, the zero-crossing point detection circuit according to this invention provides advantages in various applications.

What is claimed is:

1. A level-crossing point detection circuit for receiving an input signal having a level which varies on either side of a reference level and providing an output signal representing crossings of said input signal through said reference level, said circuit comprising:

first detection means receiving said input signal and having an output signal of at least first and second states, said first detection means output changing from its first state to its second state at a first level of said input signal when said input signal level varies in a first direction and said first detection means output signal changing from its second state to its first state at a second level of said input signal different from said first level when said input signal level varies in a second direction;

second detection means receiving said input signal and having an output signal of at least first and second states, said second detection means output signal changing from its first state to its second state at a third level of said input signal, different from said first level, when said input signal level varies in a first direction and said second detecting means output signal changing from its second state to its first state at a fourth level of said input signal, different from said second level, when said input signal level varies in said second direction; and combining means for combining the outputs of said first and second detection means to obtain said level-crossing point detection circuit output.

2. A level-crossing circuit as claimed in claim 1, wherein said first and second directions are positive and negative directions, respectively, and said second level is less than said first level and said third level is higher than said fourth level.

3. A level-crossing circuit as claimed in claim 1, wherein said reference level is between said first and fourth levels and said level-crossing point detection circuit output does not respond to changes in said input signal level between said first and fourth levels.

4. A level-crossing circuit as claimed in any one of claims 1-3, wherein said second and third levels are substantially equal to said reference level.

5. A level-crossing detection circuit as claimed in claim 1, wherein each of said detection means comprises:

an operational amplifier having a first terminal for receiving said input signal, a second terminal and an operational amplifier output; and a feedback circuit including a diode coupled in series between said operational amplifier output and said second terminal.

6. A level-crossing detection circuit as claimed in claim 5, wherein said first input terminals of each of said operational amplifiers are inverting input terminals.

7. A level-crossing detection circuit as claimed in claim 5 or 6, wherein the diode in said first detection means feedback circuit is connected in reverse polarity as compared to the diode in said second detection means.

8. A level-crossing detection circuit as claimed in claim 1, wherein said combining means provides an EXCLUSIVE OR combination of said detection means output signals.

9. A level-crossing detection circuit as claimed in claim 1, wherein said combining means includes differentiating means for differentiating the outputs of each of said detection means, level detecting means for level detecting the outputs of said differentiating means, and logic means for logically combining the outputs of said level detecting means.

* * * * *